US008674862B1

(12) United States Patent
Li et al.

(10) Patent No.: US 8,674,862 B1
(45) Date of Patent: Mar. 18, 2014

(54) SYSTEMS AND METHODS FOR DIGITAL CALIBRATION OF SUCCESSIVE-APPROXIMATION-REGISTER ANALOG-TO-DIGITAL CONVERTER

(75) Inventors: Wei Li, Fremont, CA (US); Weiqi Ding, Fremont, CA (US); Yanjing Ke, Union City, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/604,446

(22) Filed: Sep. 5, 2012

(51) Int. Cl.
*H03M 1/10* (2006.01)

(52) U.S. Cl.
USPC .......................................... 341/120; 341/172

(58) Field of Classification Search
USPC ......... 341/120, 172, 110, 150, 155, 156, 118, 341/121
See application file for complete search history.

(56) References Cited

U.S. PATENT DOCUMENTS 6,448,911 B1 * 9/2002 Somayajula ................... 341/120
2010/0265113 A1 * 10/2010 Yoshioka ...................... 341/150

OTHER PUBLICATIONS

"Understanding SAR ADCs: Their Architecture and Comparison with Other ADCs," *Maxim Integrated Products, Inc., Tutorial 1080*, Oct. 2, 2001.

* cited by examiner

*Primary Examiner* — Joseph Lauture
(74) *Attorney, Agent, or Firm* — Ropes & Gray LLP

(57) ABSTRACT

Systems and methods of calibrating a successive approximation register analog-to-digital converter (ADC) are disclosed. A plurality of capacitor stages, a first capacitor array, and a first capacitor stage are coupled in parallel. A capacitance of the first capacitor stage is compared to a sum of capacitances of the plurality of capacitor stages and of the first capacitor array. In response to the comparing, the capacitance of the first capacitor stage is increased by increasing the capacitance of a second capacitor array if the capacitance of the first capacitor stage is less than the sum of the capacitances of the plurality of capacitor stages and of the first capacitor array.

23 Claims, 5 Drawing Sheets

SYSTEMS AND METHODS FOR DIGITAL CALIBRATION OF SUCCESSIVE-APPROXIMATION-REGISTER ANALOG-TO-DIGITAL CONVERTER

FIELD

The present disclosure relates to systems and methods for digitally calibrating successive approximation register (SAR) analog-to-digital convertors (ADC), particularly charge distribution SAR ADCs.

BACKGROUND

ADCs may be used to convert a continuous analog signal into a discrete digital signal. One type of ADC is an SAR ADC. An SAR ADC uses an analog voltage comparator, a successive approximation register, and an internal digital-to-analog converter (DAC). In operation, an SAR ADC performs a binary search on each sample of the analog signal to determine an approximate digital output for each sample.

Charge distribution SAR ADCs are a common way of implementing SAR ADCs using an array of individually switched capacitor stages as the internal DAC. The array is used to perform the binary search using a comparator and a successive approximation register. Each capacitor stage has a binary-weighted capacitance and corresponds to a bit of the digital output. For example, if the most significant bit (MSB) capacitor stage has capacitance C, then the next most significant bit capacitor stages respectively have capacitances C/2, C/4, C/8, etc.

The capacitor stages may contain manufacturing defects so that the capacitance ratios between the capacitor stages may not match the above sequence of capacitance ratios, i.e. C, C/2, C/4, C/8, etc. These defects may cause the charge distribution SAR ADC to produce incorrect digital outputs in some cases and thus reduce the overall resolution of the SAR ADC. It may be necessary to calibrate the capacitor stages to correct for these defects and improve the accuracy of the SAR ADC. Both analog techniques and digital techniques exist for calibrating a charge distribution SAR ADC, but there are limitations to both types of approaches.

Analog calibration techniques may physically adjust the capacitance of each capacitor stage by adding capacitor trimmers, e.g., adding a digitally controlled capacitor array at each stage to compensate for capacitor mismatch. However, the digitally controlled capacitor array may need to be very large to cover the mismatching capacitance range in order to achieve the desired resolution in the charge distribution ADC.

Digital calibration techniques may use digital logic to calculate and store coefficients to correct each of the capacitor stages. However, digital techniques often utilize complex algorithms that require expensive and complex calibration logic. In addition, the calibration algorithms may have a long convergence time or may not be guaranteed to converge at all.

SUMMARY

To address the above and other shortcomings within the art, the present disclosure provides a digital calibration algorithm that iteratively calibrates a capacitor array one stage at a time. The algorithm uses smaller digitally controlled variable capacitor arrays at each capacitor stage and a single slide rule capacitor array to cover a wide capacitor mismatching range without significantly increasing the size of each capacitor stage.

According to one embodiment, a method of calibrating a successive approximation register (SAR) analog-to-digital converter (ADC) is disclosed. The method includes comparing a capacitance of a first capacitor stage to a sum of capacitances of a plurality of capacitor stages and of a first capacitor array. In response to the comparing, the method increases the capacitance of the first capacitor stage by increasing the capacitance of a second capacitor array when the capacitance of the first capacitor stage is less than the sum of the capacitances of the plurality of capacitor stages and of the first capacitor array. The plurality of capacitor stages, the first capacitor array, and the first capacitor stage are coupled in parallel.

According to another embodiment, a system for calibrating a successive-approximation-register (SAR) analog-to-digital converter (ADC) is disclosed. The system includes a plurality of capacitor stages coupled in parallel and a first capacitor array coupled in parallel to each of the plurality of capacitor stages. The system also includes a first capacitor stage. The first capacitor stage includes a second capacitor array, and the first capacitor stage is coupled in parallel with each of the plurality of capacitor stages and with the first capacitor array. The system also includes calibration logic. The calibration logic is configured to compare a capacitance of the first capacitor stage to a sum of capacitances of the plurality of capacitor stages and of the first capacitor array. In response to comparing, the calibration logic is configured to increase the capacitance of the first capacitor stage by increasing the capacitance of the second capacitor array when the capacitance of the first capacitor stage is less than the sum of the capacitances of the plurality of capacitor stages and of the first capacitor array.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which.

DETAILED DESCRIPTION

To provide an overall understanding of the invention, certain illustrative embodiments will now be described. However, it will be understood by one of ordinary skill in the art that the systems and methods described herein may be adapted and modified as is appropriate for the application being addressed and that the systems and methods described herein may be employed in other suitable applications, and that such other additions and modifications will not depart from the scope hereof.

Figure 1:
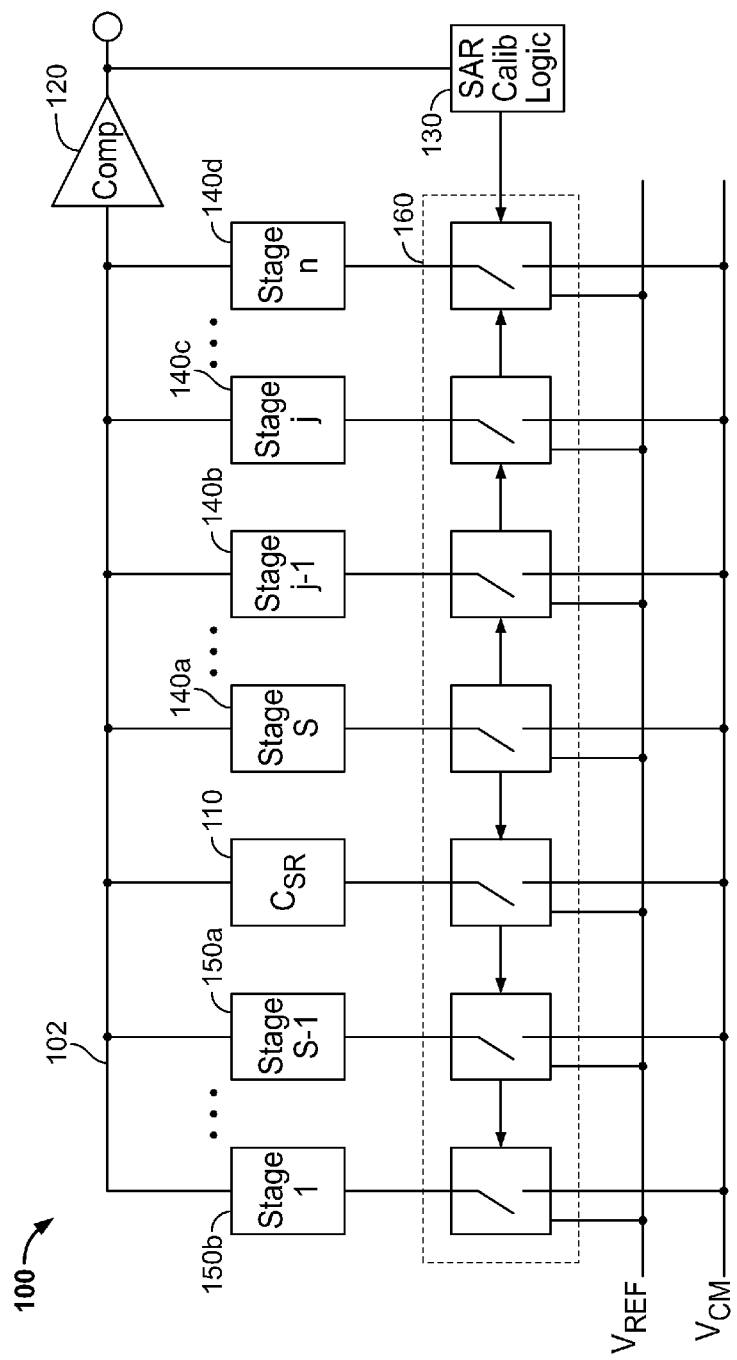
FIG. 1 shows an illustrative system for calibrating a charge distribution SAR ADC in accordance with some embodiments of the present disclosure.

FIG. 1 shows an illustrative system for calibrating a charge distribution SAR ADC in accordance with some embodiments of the present disclosure. System 100 includes a charge distribution SAR ADC circuit 102 which includes slide rule capacitor array 110, analog comparator 120, and SAR calibration logic 130. System 100 also includes n capacitor stages, where n is a positive integer. Some of the capacitor stages may not be calibrated, and are numbered from 1 to s−1, where s is an integer and s<n. The other capacitor stages may be calibrated and are numbered from s to n. For clarity, the capacitor stages that may not be calibrated will be referred to collectively as capacitor stages 150, and the capacitor stages from to n that may be calibrated will be referred to collectively as capacitor stages 140. Capacitor stages 150 may include capacitor stages 150a and 150b. Capacitor stages 150 may also include other capacitor stages that are not shown. Capacitor stages 140 include capacitor stages 140a, 140b, 140c, and 140d. Capacitor stages 140 may also include other capacitor stages that are not shown. The capacitor stages that are not shown and included within capacitor stage 140 may be interspersed anywhere within capacitor stage 140. Capacitor stage 140a is the sth capacitor stage, capacitor stage 140b is the (j−1)th capacitor stage, capacitor stage 140c is the jth capacitor stage, and capacitor stage 140d is the nth capacitor stage. Capacitor stages 140 may include other capacitor stages to be calibrated that are not shown.

System 100 also includes a network of switches 160 that include a switch connected in series with slide rule capacitor array 110 and each of capacitor stages 140 and 150. Switches 160 may be controlled by SAR calibration logic 130 to selectively connect slide rule capacitor array 110 or a particular capacitor stage to either a reference voltage ($V_{REF}$) or a common mode voltage ($V_{CM}$).

To properly perform the binary search function required by SAR ADC, each of capacitor stages 140 may be calibrated to improve the accuracy of SAR ADC circuit 102. Each of capacitor stages 140 may include a variable capacitor whose capacitance may be controlled by SAR calibration logic 130.

Slide rule capacitor array 110 has a variable capacitance that may be controlled by SAR calibration logic 130 during the calibration of each of capacitor stages 140. Also, as part of the calibration, comparator 120 may be used to compare voltage inputs to drive the operation of SAR calibration logic 130.

In general, SAR calibration logic 130 may calibrate capacitor stages 140 incrementally, starting at stage s (capacitor stage 140a) and continuing to subsequent stages, i.e. stage s+1, stage s+2, ..., stage n. Under some circumstances, SAR calibration logic 130 may recalibrate a previous capacitor stage. Thus, in operation, the calibration process may step up from lower indexed to higher indexed capacitor stages. The calibration process is complete when SAR calibration logic 130 has finished calibrating stage n (capacitor stage 140d). Additional details regarding the calibration process are provided further below.

In some embodiments, system 100 may include more or fewer capacitor stages and switches than shown in FIG. 1. In some embodiments, all of the capacitor stages in system 100 may be calibrated by SAR calibration logic 130.

Figure 2:
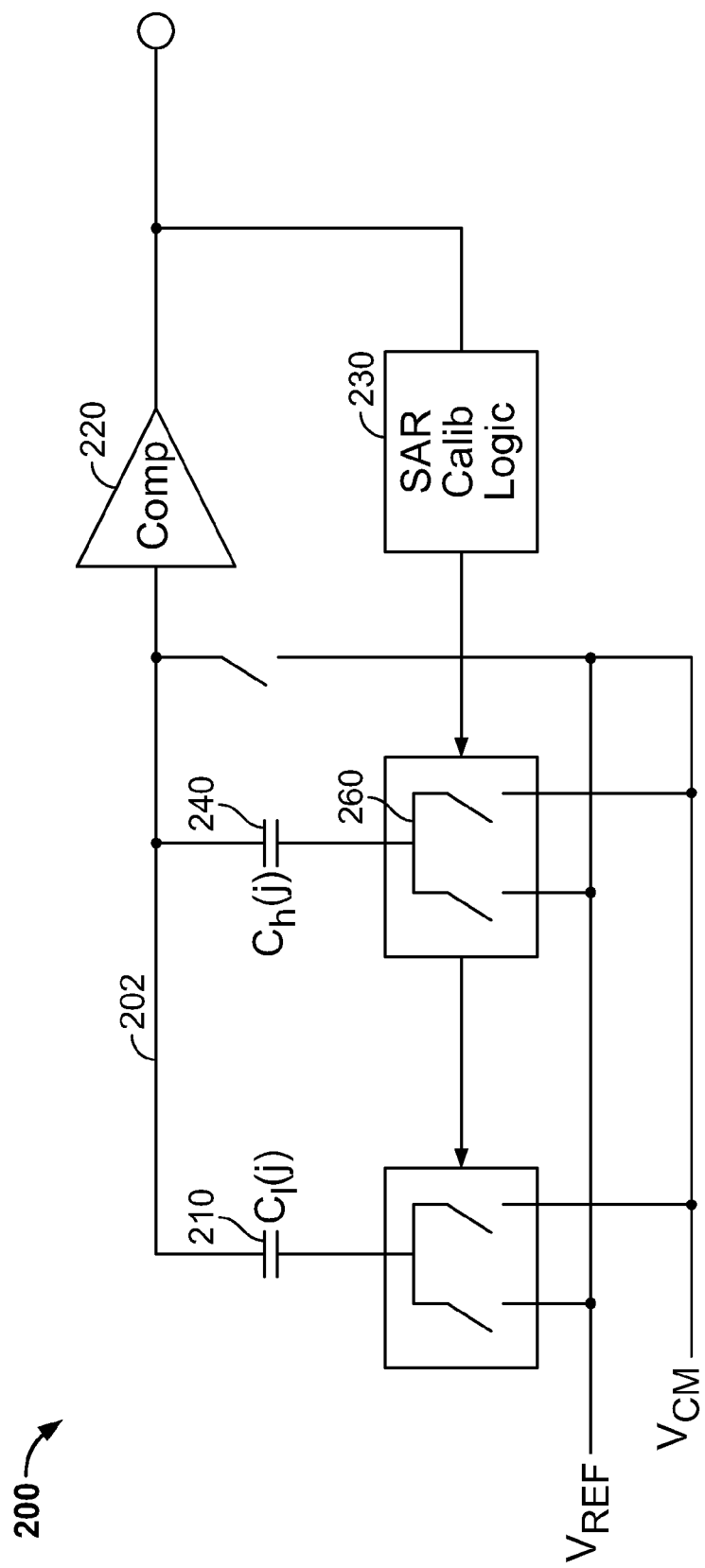
FIG. 2 shows a simplified version of the system of FIG. 1 in accordance with some embodiments of the present disclosure.

FIG. 2 shows a simplified version of the system of FIG. 1 in accordance with some embodiments of the present disclosure. A system 200 is a simplified version of system 100 for illustrating the principle behind the sliding calibration process described above for an individual capacitor stage, e.g., capacitor stage 140c (stage j). System 200 includes SAR ADC circuit 202 which includes comparator 220 (corresponding to comparator 120), capacitor 210, capacitor 240, SAR calibration logic 230 (corresponding to the switches 130), and a network of switches 260 (corresponding to the switches 160).

In system 200, capacitor 240 corresponds to an individual capacitor stage in, for example, system 100, such as, the capacitor stage 140c (e.g., stage j). The capacitance $C_h(j)$ of capacitor 240 is substantially equal to the total capacitance of capacitor stage 140c (e.g., stage j). In system 200, the capacitor stages from stage j+1 to stage n are not connected to either $V_{REF}$ or $V_{CM}$ and are not shown in FIG. 2. The capacitance of capacitor 210 corresponds to, for example, the sum of the capacitances of slide rule capacitor array 110 of FIG. 1 and all of the capacitor stages from 1 to j−1, such as capacitor stages 140a, 140b, 150a, and 150b of FIG. 1. Thus, the capacitance $C_l(j)$ of capacitor 210 is equal to the sum of the capacitance $C_{sr}$ of slide rule capacitor array 110 of FIG. 1 and the capacitances of all the capacitor stages from 1 to j−1 shown in FIG. 1. Therefore $C_l(j)$ is defined according to the equation $$C_l(J)=C_{sr}-\Sigma_{k=1}^{j-1}C_k$$

where $C_k$ is the total capacitance of a capacitor stage k.

For proper calibration, the value of the capacitance $C_h$ should be as close as possible to the value of the capacitance $C_l(j)$. One process of calibration involves charging and discharging capacitors 210 and 240 between $V_{REF}$ and $V_{CM}$ alternately to obtain a residual voltage according to the equation $$\Delta V=(C_h(j)-C_l(j))*V_{REF}/(C_h(j)+C_l(j)).$$

The goal of the calibration process at each capacitor stage to be calibrated is, for example, to minimize the value of $\Delta V$. The calibration process may attempt to minimize the value of $\Delta V$ by adding compensating capacitance to either $C_l(j)$ or $C_h(j)$. In the above example, with stage j (e.g., capacitor stage 140c of FIG. 1), the value of $C_l(j)$ depends on the capacitance $C_{sr}$ of the slide rule capacitor array 110 of FIG. 1, and the value of $C_h(j)$ is substantially equal to the total capacitance of capacitor stage 140c. Therefore, referring back to FIG. 1, adding compensating capacitance may be accomplished by varying the capacitance of slide rule capacitor array 110 and/or the capacitance of capacitor stage 140c.

To check if calibration of stage j (capacitor stage 140c) is complete, comparator 220 compares the value of $\Delta V$ with ground voltage and sends as output the result of the comparison to SAR calibration logic 230. For example, the output of comparator 220 may be 1 when $\Delta V$ is positive (i.e. greater than ground voltage) and 0 when $\Delta V$ is negative (i.e. less than ground voltage). In our example, SAR calibration logic 230 may continue to calibrate stage j (e.g., capacitor stage 140c of FIG. 1) until comparator 220's decision flips value, i.e. $\Delta V$ changes sign. Then SAR calibration logic 230 fixes the capacitance settings for stage j and moves to calibrate the next stage j+1.

Figure 3:
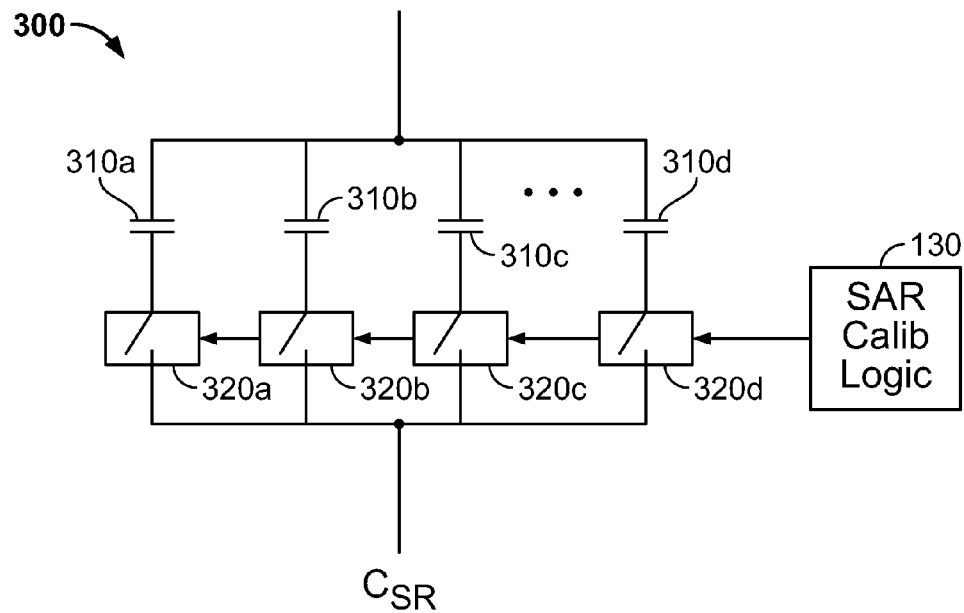
FIG. 3 shows an illustrative slide rule capacitor array in accordance with some embodiments of the present disclosure.

FIG. 3 shows an illustrative slide rule capacitor array in accordance with some embodiments of the present disclosure. Slide rule capacitor array 300 may include a number of capacitors 310a, 310b, 310c, and 310d connected in parallel. Slide rule capacitor array 300 may also include a number of switches 320a, 320b, 320c, and 320d (collectively switches 320) that may each be individually controlled by SAR calibration logic 130. SAR calibration logic 130 may vary the capacitance $C_{sr}$ of slide rule capacitor array 300 within a certain range by connecting or disconnecting individual capacitors from slide rule capacitor array 300 via switches 320. Thus, connecting or disconnecting an individual capacitor from slide rule capacitor array 300 would increase or decrease $C_{sr}$, respectively, by the capacitance of the connected or disconnected capacitor. Slide rule capacitor array 300 may have a minimum capacitance value and a maximum capacitance value, and the capacitance of the capacitor array 300 may be varied between these two values. In some embodiments, the capacitances of the individual capacitors 310 may be equal so that SAR calibration logic 130 may increment or decrement $C_{sr}$ in fixed amounts of capacitance, for example, by a unit of capacitance equal to the capacitance of one of capacitors 310.

Slide rule capacitor array 300 may be similar in form and function to slide rule capacitor array 110 of FIG. 1. In some embodiments, slide rule capacitor array 300 may include more or fewer capacitors and switches than shown in FIG. 3.

Figure 4:
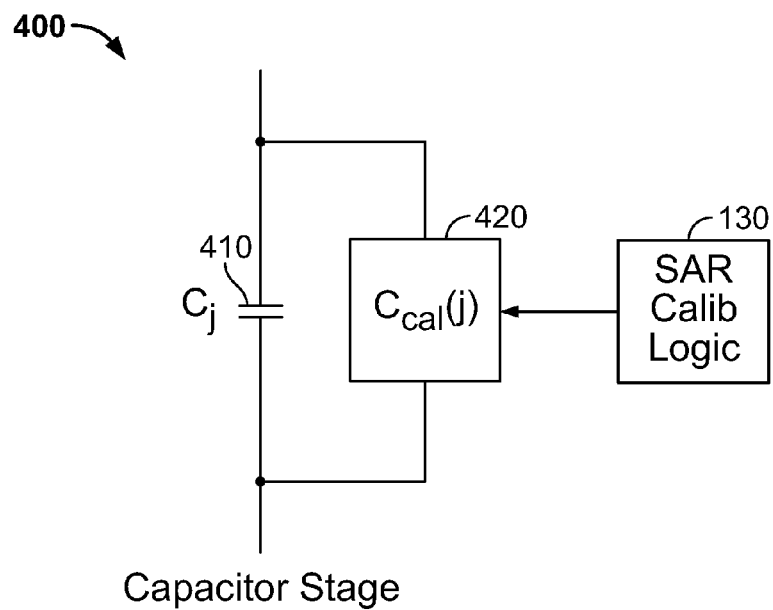
FIG. 4 shows an illustrative capacitor stage in accordance with some embodiments of the present disclosure.

FIG. 4 shows an illustrative capacitor stage in accordance with some embodiments of the present disclosure. Capacitor stage 400 includes capacitor 410 and variable capacitor 420 that is controlled by SAR calibration logic 130 of FIG. 1. Capacitor stage 400 may be similar in form and function to the capacitor stage j (capacitor stage 140c) of FIG. 1.

Capacitor 410 may have a capacitance of $C_j$, and variable capacitor 420 may have a capacitance of $C_{cal}(j)$ which the SAR calibration logic 130 may adjust within a certain range. The total capacitance of the capacitor stage 400 may be $C_j+C_{cal}(j)$. Capacitor stage 400 may have a minimum capacitance value and a maximum capacitance value, and the capacitance of capacitor stage 400 may be varied between these two values. Referring back to FIG. 2, for example, if the capacitor stage 400 is the capacitor stage currently being calibrated in the system 200, then the total capacitance $C_h(j)$ may be substantially equal to $C_j+C_{cal}(j)$.

The SAR calibration logic 130 may adjust $C_{cal}(j)$ to calibrate the capacitor stage 400. In some embodiments, SAR calibration logic 130 may increment or decrement $C_{cal}$ in fixed amounts of capacitance.

Figure 5:
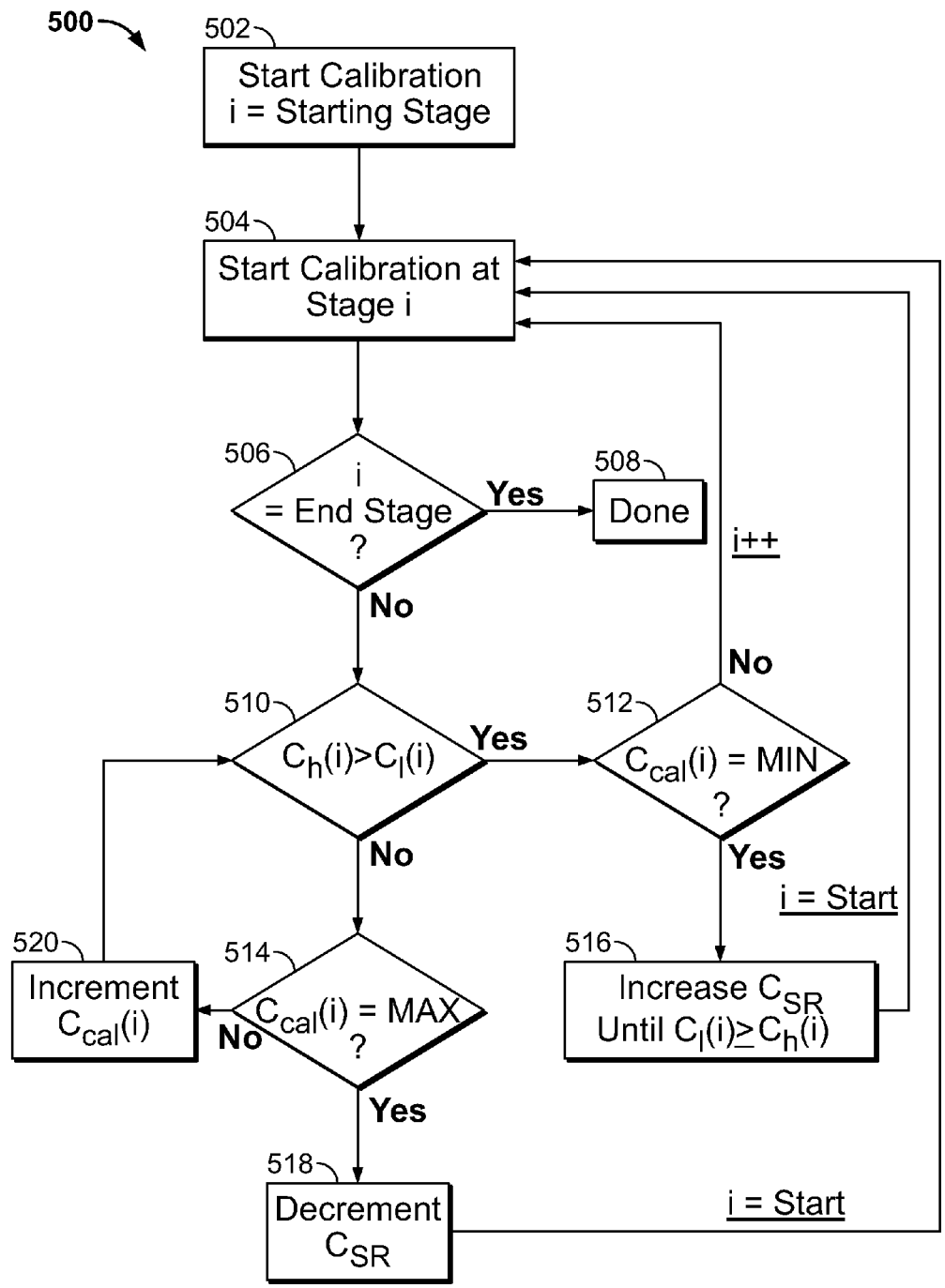
FIG. 5 shows an illustrative flow diagram of a process of calibrating an SAR ADC in accordance with some embodiments of the present disclosure.

FIG. 5 shows an illustrative flow diagram of a process 500 of calibrating an SAR ADC in accordance with some embodiments of the present disclosure. Process 500 may begin at step 502. At step 502, a counter variable i may be used to keep track of the capacitor stage being currently calibrated, where i is a positive integer. Variable i may be initially set to s, the index of the capacitor stage to be calibrated first.

At step 504, the SAR calibration logic, for example, SAR calibration logic 130, may start calibration at the capacitor stage i. During the calibration, the higher capacitor stages, i.e. stage i+1 to stage n (e.g., stage 140d of FIG. 1), may not be connected to either $V_{REF}$ or $V_{CM}$. As described above, the goal of the calibration at the capacitor stage i is to minimize the difference between the capacitances $C_h(i)$ and $C_l(i)$. As described above, the capacitance $C_h(i)$ may be the total capacitance of the capacitor stage i, so $C_h(i)$ may be substantially equal to $C_i+C_{cal}(i)$. The capacitance $C_l(i)$ may be substantially equal to the sum of the capacitances of all of the capacitor stages from 1 to i−1 and the capacitance $C_{sr}$ of slide rule capacitor array 110.

SAR calibration logic 130 may attempt to minimize this difference by adjusting $C_l(i)$, e.g., by varying $C_{sr}$ (the capacitance of slide rule capacitor array 110), and/or by adjusting $C_h(i)$, e.g., by varying $C_{cal}(i)$ (the capacitance of the variable capacitor of the capacitor stage i). This will be described in greater detail below.

At step 506, SAR calibration logic 130 may determine whether calibration of the SAR ADC is complete, i.e., whether SAR calibration logic 130 has completed calibration of stage n (i.e., calibration stage 140d). If calibration of stage n is complete, then at step 508, SAR calibration logic 130 may stop calibration, and the SAR ADC may be ready for operation. If calibration is not complete, then process 500 may continue to step 510.

At step 510, SAR calibration logic 130 may determine whether $C_h(i)>C_l(i)$ using comparator 120 to compare a residual voltage $\Delta V=(C_h(j)-C_l(j))*V_{REF}/(C_h(j)+C_l(j))$ to ground as described above. If $C_h(i)>C_l(i)$ then the calibration at stage i may potentially be complete, and process 500 proceeds to 512. Otherwise, the calibration at stage i may not be complete, and process 500 may proceed to step 514.

At step 512, the condition $C_h(i)>C_l(i)$ may be determined to be true based on the output of comparator 120 as described above. This may indicate that the calibration at stage i may be complete if $C_{cal}(i)$, the capacitance of the variable capacitor of the capacitor stage i, has been incremented above a minimum value. As described previously, $C_{cal}(i)$ may be varied between a minimum value and a maximum value by SAR calibration logic 130. The reason for checking whether $C_{cal}(i)$ has been incremented may be to avoid adding potentially unnecessary calibrating capacitance at higher stages (above i). For example, if $C_{cal}(i)$ has not been incremented, then it may be desirable to recalibrate previous stages with a higher $C_{csr}$ value. Thus, at step 512, SAR calibration logic 130 may determine whether $C_{cal}(i)$ is at the minimum value. If $C_{cal}(i)$ is not at the minimum value, the variable i may be incremented, and process 500 may continue to 504 to start calibration of the next capacitor stage i+1. Otherwise, at step 512, if $C_{cal}(i)$ is at the minimum value, then process 500 may continue to step 516, where SAR calibration logic 130 may increase $C_{csr}$, the capacitance of slide rule capacitor array 110, until $C_h(i)<=C_l(i)$. Then the variable i may be set to s, and process 500 may continue to 504 to restart calibration of all the stages below the capacitor stage i, starting at the capacitor stage s.

At step 514, the condition $C_h(i)>C_l(i)$ may be determined to be false based on the output of comparator 120 as described above, so calibration of stage i may be necessary by increasing $C_h(i)$ relative to $C_l(i)$. SAR calibration logic 130 may attempt to increase $C_h(i)$ relative to $C_l(i)$ by increasing $C_{cal}(i)$ if possible or by decreasing $C_l(i)$ if increasing $C_{cal}(i)$ is not possible. To check if increasing $C_{cal}(i)$ is possible, SAR calibration logic 130 may determine whether $C_{cal}(i)$ is at a maximum value. If $C_{cal}(i)$ is at the maximum value, then process 500 may proceed to step 518. At step 518, the SAR calibration logic may decrease $C_l(i)$ by decrementing $C_{csr}$ and may set the variable i to s. Because $C_{csr}$ has changed, process 500 may then return to step 504 to restart calibration of all the stages below the capacitor stage i, starting at the capacitor stage s. However, if $C_{cal}(i)$ is not at the maximum value at step 514, process 500 may proceed to step 520. At step 520, the SAR calibration logic may increment $C_{cal}(i)$ and may return to step 510 to determine whether $C_h(i)>C_l(i)$.

To ensure that process 500 will complete, a loop counter variable or other suitable mechanism may be used to prevent process 500 from looping and to ensure that calibration is continued.

Figure 6:
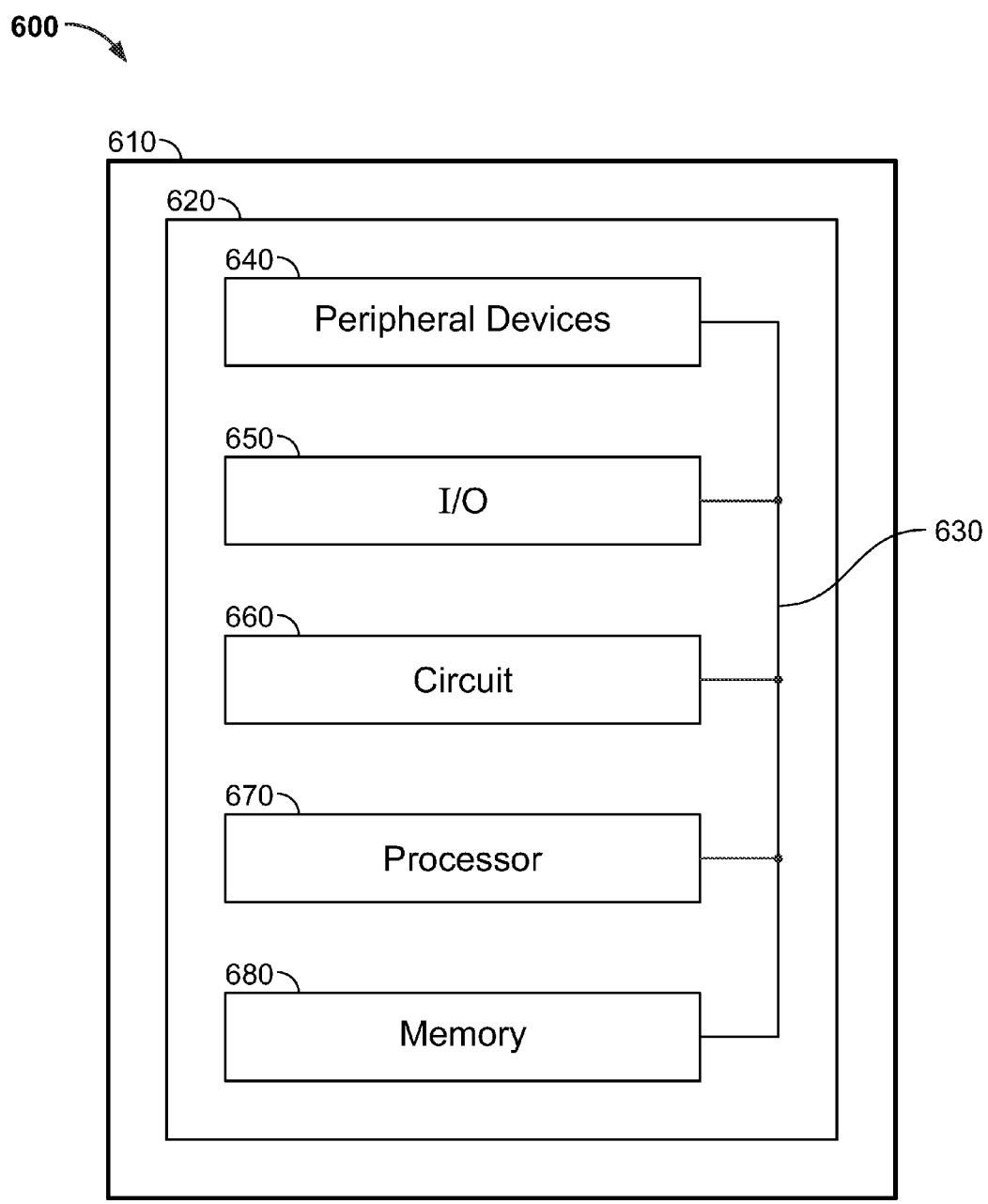
FIG. 6 shows an illustrative system that may be used to implement some embodiments of the present disclosure.

FIG. 6 shows an illustrative system that may be used to implement some embodiments of the present disclosure. System 600 may be or may include a circuit or other device (e.g., ADC circuit, processing block, integrated circuit, application specific standard product (ASSP), application specific integrated circuit (ASIC), programmable logic device (PLD), full-custom chip, dedicated chip). System 600 can include one or more of the following components: a processor 670, memory 680, I/O circuitry 650, a circuit 660, and peripheral devices 640. Circuit 660 may contain one or more circuits similar in form and function to system 100 of FIG. 1. These components are connected together by a system bus or other interconnections 630 and are populated on a circuit board 620 which is contained in an end-user system 610.

System 600 may be used in a wide variety of applications, such as computer networking, data networking, instrumentation, video processing, digital signal processing, or any other application where the advantage of using programmable or reprogrammable logic is desirable. Circuit 660 may be used to perform a variety of different logic functions and/or calculate a variety of different mathematical functions. For example, circuit 660 may be used to perform ADC for certain types of signal processing. It should be noted that system 600 is only exemplary, and that the true scope and spirit of the embodiments should be indicated by the following claims.

The foregoing is merely illustrative of the principles of the embodiments and various modifications can be made by those skilled in the art without departing from the scope and spirit of the embodiments disclosed herein. The above described embodiments of the present disclosure are presented for purposes of illustration and not of limitation, and the present invention is limited only by the claims which follow.

What is claimed is:

1. A method of calibrating a successive approximation register (SAR) analog-to-digital converter (ADC), the method comprising:
   comparing a capacitance of a first capacitor stage to a sum of capacitances of a plurality of capacitor stages and of a first capacitor array; and
   in response to the comparing, increasing the capacitance of the first capacitor stage by increasing the capacitance of a second capacitor array when the capacitance of the first capacitor stage is less than the sum of the capacitances of the plurality of capacitor stages and of the first capacitor array, wherein the plurality of capacitor stages, the first capacitor array, and the first capacitor stage are coupled in parallel.

2. The method of claim 1, comprising
   repeating the comparing and the increasing until the capacitance of the first capacitor stage exceeds the sum of the capacitances of the plurality of capacitor stages and of the first capacitor array.

3. The method of claim 2, comprising
   performing a calibration at a second capacitor stage when the capacitance of the first capacitor stage exceeds the sum of the capacitances of the plurality of capacitor stages and of the first capacitor array.

4. The method of claim 2, comprising
   determining whether the capacitance of the second capacitor array has been increased to a maximum value; and
   reducing the capacitance of the first capacitor array when the capacitance of the second capacitor array has been increased to the maximum value, and the capacitance of the first capacitor stage is less than the sum of the capacitances of the plurality of capacitor stages and of the first capacitor array.

5. The method of claim 2, comprising
   determining whether the capacitance of the second capacitor array has been increased above a minimum value; and
   increasing the capacitance of the first capacitor array when the capacitance of the second capacitor array has not been increased above the minimum value, and the capacitance of the first capacitor stage exceeds the sum of the capacitances of the plurality of capacitor stages and of the first capacitor array.

6. The method of claim 5, comprising
   repeating the steps of determining whether the capacitance of the second capacitor array has been increased above a minimum value and increasing the capacitance of the first capacitor array until the capacitance of the first capacitor stage is less than the sum of the capacitances of the plurality of capacitor stages and of the first capacitor array.

7. The method of claim 6, comprising
   after increasing the capacitance of the first capacitor array until the capacitance of the first capacitor stage is less than the sum of the capacitances of the plurality of capacitor stages and of the first capacitor array, performing calibration at a starting capacitor stage in the plurality of capacitor stages.

8. The method of claim 1, wherein the first capacitor array and the second capacitor array each comprise a plurality of capacitors connected in parallel.

9. The method of claim 1, comprising
   storing a counter value, wherein, when the counter value exceeds a threshold value, calibration of the first capacitor stage is halted and calibration of a second capacitor stage is initiated.

10. A system for calibrating a successive-approximation-register (SAR) analog-to-digital converter (ADC) comprising:
    a plurality of capacitor stages coupled in parallel;
    a first capacitor array coupled in parallel to each of the plurality of capacitor stages;
    a first capacitor stage comprising a second capacitor array, the first capacitor stage coupled in parallel with each of the plurality of capacitor stages and with the first capacitor array; and
    calibration logic configured to:
      compare a capacitance of the first capacitor stage to a sum of capacitances of the plurality of capacitor stages and of the first capacitor array; and
      in response to comparing, increase the capacitance of the first capacitor stage by increasing the capacitance of the second capacitor array when the capacitance of the first capacitor stage is less than the sum of the capacitances of the plurality of capacitor stages and of the first capacitor array.

11. The system of claim 10, wherein the calibration logic is configured to repeat the comparing and the increasing until the capacitance of the first capacitor stage exceeds the sum of the capacitances of the plurality of capacitor stages and of the first capacitor array.

12. The system of claim 11, wherein the calibration logic is further configured to perform calibration at a second capacitor stage when the capacitance of the first capacitor stage exceeds the sum of the capacitances of the plurality of capacitor stages and of the first capacitor array.

13. The system of claim 11, wherein the calibration logic is configured to:
    determine whether the capacitance of the second capacitor array has been increased above a minimum value; and
    increase the capacitance of the first capacitor array when the capacitance of the second capacitor array has not been increased above the minimum value, and the capacitance of the first capacitor stage exceeds the sum of the capacitances of the plurality of capacitor stages and of the first capacitor array.

14. The system of claim 13, wherein the calibration process is configured to repeat the determining whether the capacitance of the second capacitor array has been increased above a minimum value and increasing the capacitance of the first capacitor array until the capacitance of the first capacitor stage is less than the sum of the capacitances of the plurality of capacitor stages and of the first capacitor array.

15. The system of claim 14, wherein the calibration logic is configured to perform calibration at a starting capacitor stage in the plurality of capacitor stages after increasing the capacitance of the first capacitor array until the capacitance of the first capacitor stage is less than the sum of the capacitances of the plurality of capacitor stages and of the first capacitor array.

16. The system of claim 10, wherein the calibration logic is configured to
   determine whether the capacitance of the second capacitor array has been increased to a maximum value; and
   reduce the capacitance of the first capacitor array when the capacitance of the second capacitor array has been increased to the maximum value, and the capacitance of the first capacitor stage does not exceed the sum of the capacitances of the plurality of capacitor stages and of the first capacitor array.

17. The system of claim 10, wherein the first capacitor array and the second capacitor array each comprise a plurality of capacitors coupled in parallel.

18. The system of claim 10, wherein the calibration logic is configured to
   store a counter value;
   halt calibration at the first capacitor stage; and
   perform calibration at a second capacitor stage if the counter value exceeds a threshold.

19. A system for calibrating a successive approximation register (SAR) analog to digital converter (ADC) comprising:
   digital to analog converter (DAC) circuitry comprising a plurality of capacitor stages coupled in parallel, each capacitor stage coupled in series with a controllable switch associated with the capacitor stage; and
   calibration circuitry configured to
      calibrate a first capacitor stage of the plurality of capacitor stages by adjusting a capacitance of the first capacitor stage, and
      operate the controllable switch associated with the first capacitor stage to connect the first capacitor stage to a reference voltage source or a common mode voltage source, wherein the DAC circuitry comprises a capacitor array and the calibration circuitry is configured to compare via a comparator a capacitance of the first capacitor stage to a sum of capacitances of the other capacitor stages of the plurality of capacitor stages and a capacitance of the capacitor array.

20. A system for calibrating a successive-approximation-register (SAR) analog-to-digital converter (ADC) comprising:
   a plurality of capacitor stages coupled in parallel;
   a first capacitor array coupled in parallel to each of the plurality of capacitor stages, wherein:
      the plurality of capacitor stages comprises a first sub-plurality of capacitor stages and a second sub-plurality of capacitor stages,
      a first capacitor stage of the second sub-plurality of capacitor stages comprises a second capacitor array; and
      the first sub-plurality of capacitor stages is not calibrated and the second plurality of capacitor stages is calibrated based on capacitances of the first sub-plurality of capacitor stages and of the first capacitor array.

21. The system of claim 20, further comprising a plurality of switches connected in series with the first capacitor array and with respective ones of the plurality of capacitor stages, each switch of the plurality of switches being configured to selectively connect the first capacitor array and the respective ones of the plurality of capacitor stages to one of a reference voltage and a common mode voltage.

22. The system of claim 21, further comprising:
   calibration logic coupled to the plurality of switches; and
   a comparator having an input coupled to each capacitor stage of the plurality of capacitor stages, and an output coupled to the calibration logic.

23. The system of claim 20, further comprising calibration logic configured to:
   compare a capacitance of the first capacitor stage to a sum of the capacitances of the first sub-plurality of capacitor stages and of the first capacitor array; and
   in response to comparing, increase the capacitance of the first capacitor stage by increasing the capacitance of the second capacitor array when the capacitance of the first capacitor stage is less than the sum of the capacitances of the first sub-plurality of capacitor stages and of the first capacitor array.

* * * * *